United States Patent
Honda et al.

(10) Patent No.: US 11,972,958 B2
(45) Date of Patent: Apr. 30, 2024

(54) SUBSTRATE PROCESSING APPARATUS AND SUBSTRATE PROCESSING METHOD

(71) Applicant: Tokyo Electron Limited, Tokyo (JP)

(72) Inventors: Takumi Honda, Koshi (JP); Hiroyuki Masutomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 246 days.

(21) Appl. No.: 17/318,019

(22) Filed: May 12, 2021

(65) Prior Publication Data

US 2021/0358773 A1    Nov. 18, 2021

(30) Foreign Application Priority Data

May 13, 2020   (JP) ................................ 2020-084741

(51) Int. Cl.
*H01L 21/67* (2006.01)
*H01L 21/3213* (2006.01)

(52) U.S. Cl.
CPC .. *H01L 21/67086* (2013.01); *H01L 21/32134* (2013.01)

(58) Field of Classification Search
CPC ..................... H01L 21/67086; H01L 21/32134
See application file for complete search history.

(56) References Cited

U.S. PATENT DOCUMENTS

| | | | | |
|---|---|---|---|---|
| 6,352,083 | B1 * | 3/2002 | Araki | H01L 21/67051 134/94.1 |
| 6,766,818 | B2 * | 7/2004 | Kashkoush | G05D 11/138 156/345.24 |
| 2008/0023444 | A1 * | 1/2008 | Osawa | H01L 21/6708 156/345.15 |
| 2008/0066863 | A1 * | 3/2008 | Kiyose | H01L 21/67086 156/345.15 |
| 2013/0056037 | A1 * | 3/2013 | Terashima | H01L 21/67057 134/184 |
| 2017/0358470 | A1 * | 12/2017 | Tanaka | H01L 21/67248 |

(Continued)

FOREIGN PATENT DOCUMENTS

| | | |
|---|---|---|
| JP | H10-335295 A | 12/1998 |
| JP | 2018-014470 A | 1/2018 |

*Primary Examiner* — Karla A Moore
*Assistant Examiner* — Margaret Klunk
(74) *Attorney, Agent, or Firm* — Pearne & Gordon LLP

(57) ABSTRACT

A substrate processing apparatus includes a processing tub configured to perform an etching processing therein by immersing multiple substrates in a processing liquid; a first and second discharge opening groups disposed under the substrates within the processing tub, and configured to discharge the processing liquid into the processing tub; a first adjusting device configured to change a flow rate of the processing liquid discharged from the first discharge opening group; a second adjusting device configured to change a flow rate of the processing liquid discharged from the second discharge opening group; a controller configured to control the first and second adjusting devices to perform, during the etching processing, a flow rate adjusting processing of increasing and decreasing the flow rate of the processing liquid discharged from the first discharge opening group and the flow rate of the processing liquid discharged from the second discharge opening group to different values.

10 Claims, 10 Drawing Sheets

(56) References Cited

U.S. PATENT DOCUMENTS

2019/0080937 A1\* 3/2019 Tsuchiya ............ H01L 21/67017
2019/0355595 A1\* 11/2019 Sun .................... H01L 21/30604
2020/0098597 A1\* 3/2020 Takahashi ............. H01L 21/302

\* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-084741 filed on May 13, 2020, the entire disclosure of which is incorporated herein by reference.

TECHNICAL FIELD

The various aspects and embodiments described herein pertain generally to a substrate processing apparatus and a substrate processing method.

BACKGROUND

Patent Document 1 describes a technique of etching a plurality of substrates en bloc by immersing them in a processing vessel in which a processing liquid is stored.

Patent Document 1: Japanese Patent Laid-open Publication No. 2018-014470

SUMMARY

In one exemplary embodiment, a substrate processing apparatus includes a processing tub, a first discharge opening group and a second discharge opening group, a first adjusting device, a second adjusting device and a controller. The processing tub is configured to perform an etching processing therein by immersing multiple substrates in a processing liquid. The first discharge opening group and the second discharge opening group are disposed under the multiple substrates within the processing tub, and configured to discharge the processing liquid into the processing tub. The first adjusting device is configured to change a flow rate of the processing liquid discharged from the first discharge opening group. The second adjusting device is configured to change a flow rate of the processing liquid discharged from the second discharge opening group. The controller is configured to control the first adjusting device and the second adjusting device to perform, during the etching processing, a flow rate adjusting processing of increasing and decreasing the flow rate of the processing liquid discharged from the first discharge opening group and the flow rate of the processing liquid discharged from the second discharge opening group to different values.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
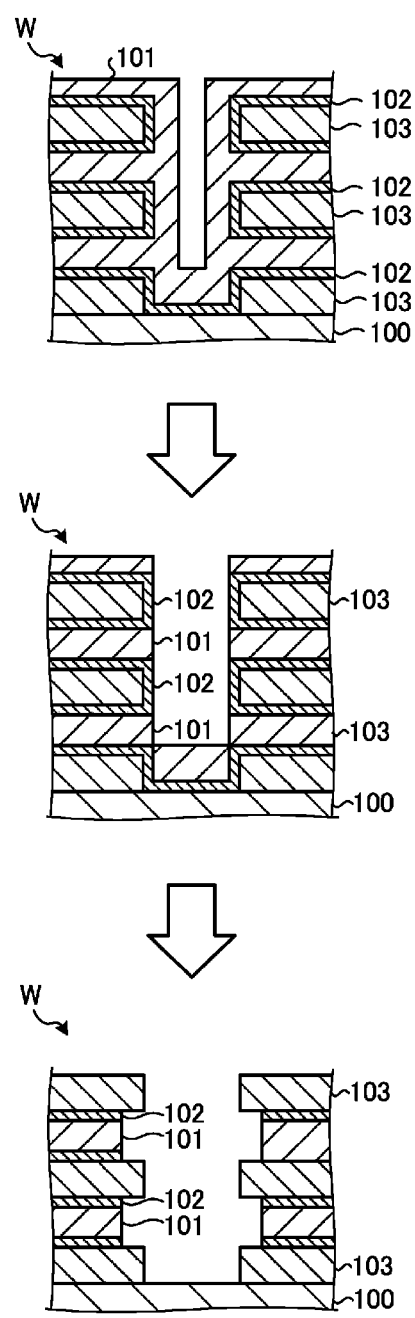
FIG. 1 is a diagram illustrating an example of a substrate processing.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, various embodiments (hereinafter, referred to as "exemplary embodiments") for implementing a substrate processing apparatus and a substrate processing method according to the present disclosure will be described in detail with reference to the accompanying drawings. However, it should be noted that the present disclosure is not limited by these exemplary embodiments. Further, the various exemplary embodiments can be appropriately combined as long as the contents of processings are not contradictory. Furthermore, in the following exemplary embodiments, same parts will be assigned same reference numerals and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

In order to ease understanding of the following description, the X-axis direction, Y-axis direction and Z-axis direction which are orthogonal to each other are defined, and an orthogonal coordinate system in which the positive Z-axis direction is regarded as a vertically upward direction may be used in the following drawings. Further, a rotational direction around a vertical axis may be referred to as "0 direction."

<Substrate Processing>

First, an example of a substrate processing according to the present disclosure will be explained with reference to FIG. 1. FIG. 1 is a diagram showing the example of the substrate processing.

As depicted in FIG. 1, in the substrate processing according to the present disclosure, a wafer W having, for example, a tungsten film 101, titanium nitride films 102 and silicon oxide films 103 formed on a polysilicon film 100 is etched. To elaborate, the silicon oxide films 103 are formed on the polysilicon film 100 in multiple layers at a certain distance therebetween, and the titanium nitride films 102 are formed around the silicon oxide films 103 to cover these silicon oxide films 103. Further, the tungsten film 101 is formed to cover the titanium nitride films 102 and the silicon oxide films 103. In a state before the etching processing, the titanium nitride films 102 and the silicon oxide films 103 are covered with the tungsten film 101.

In the substrate processing according to the present disclosure, by performing etch-back of the tungsten film 101 and the titanium nitride films 102, a recess is formed on the wafer W. A processing liquid containing, for example, phosphoric acid ($H_3PO_4$), acetic acid ($CH_3COOH$), nitric acid ($HNO_3$) and water ($H_2O$) as components may be used as a processing liquid for etching the tungsten film 101 and the titanium nitride films 102.

To elaborate, only the tungsten film 101 exposed on a surface of the wafer W is etched first, so that the titanium nitride films 102 covered with the tungsten film 101 are exposed (first etching processing). Then, the tungsten film 101 and the titanium nitride films 102 are etched at the same time (second etching processing).

Patent Document 1 discloses a technique of improving uniformity of an etching processing by forming a liquid flow of a processing liquid within a processing tub by supplying a gas such as a nitrogen gas from a gas nozzle which is provided at a bottom of the processing tub.

In this technique, however, there is a concern that a region (hereinafter, referred to as "abnormal region") with an extremely small etching amount may be formed within the wafer.

One of the reasons for the formation of this abnormal region may be stagnation of the liquid flow. That is, if there is a place where the processing liquid does not flow but stays, the processing liquid may not be replaced well in this region, which might cause a reduction of an etching amount in that region.

In view of the foregoing problem, in a first exemplary embodiment, by disturbing the liquid flow within the processing tub intentionally, occurrence of stagnation of the liquid flow at a certain region is suppressed. Therefore, since the abnormal region is difficult to form, uniformity of the etching processing can be improved.

Further, galvanic corrosion which occurs in the second etching processing is also regarded as one of the reasons for the formation of the abnormal region. The galvanic corrosion is a phenomenon whereby one metal having a lower potential (standard electrode potential) corrodes rapidly when two dissimilar metals are brought into contact with each other in an aqueous solution. The galvanic corrosion takes place conspicuously if a flow rate of the gas supplied into the processing tub is increased.

In view of the foregoing, in a second exemplary embodiment, the supply of the gas into the processing tub is restricted after a lapse of a certain time from the beginning of the etching processing. Accordingly, occurrence of the galvanic corrosion can be suppressed in the second etching processing in which the tungsten film 101 and the titanium nitride films 102 are etched at the same time.

FIRST EXEMPLARY EMBODIMENT

<Configuration of Substrate Processing Apparatus>

Figure 2:
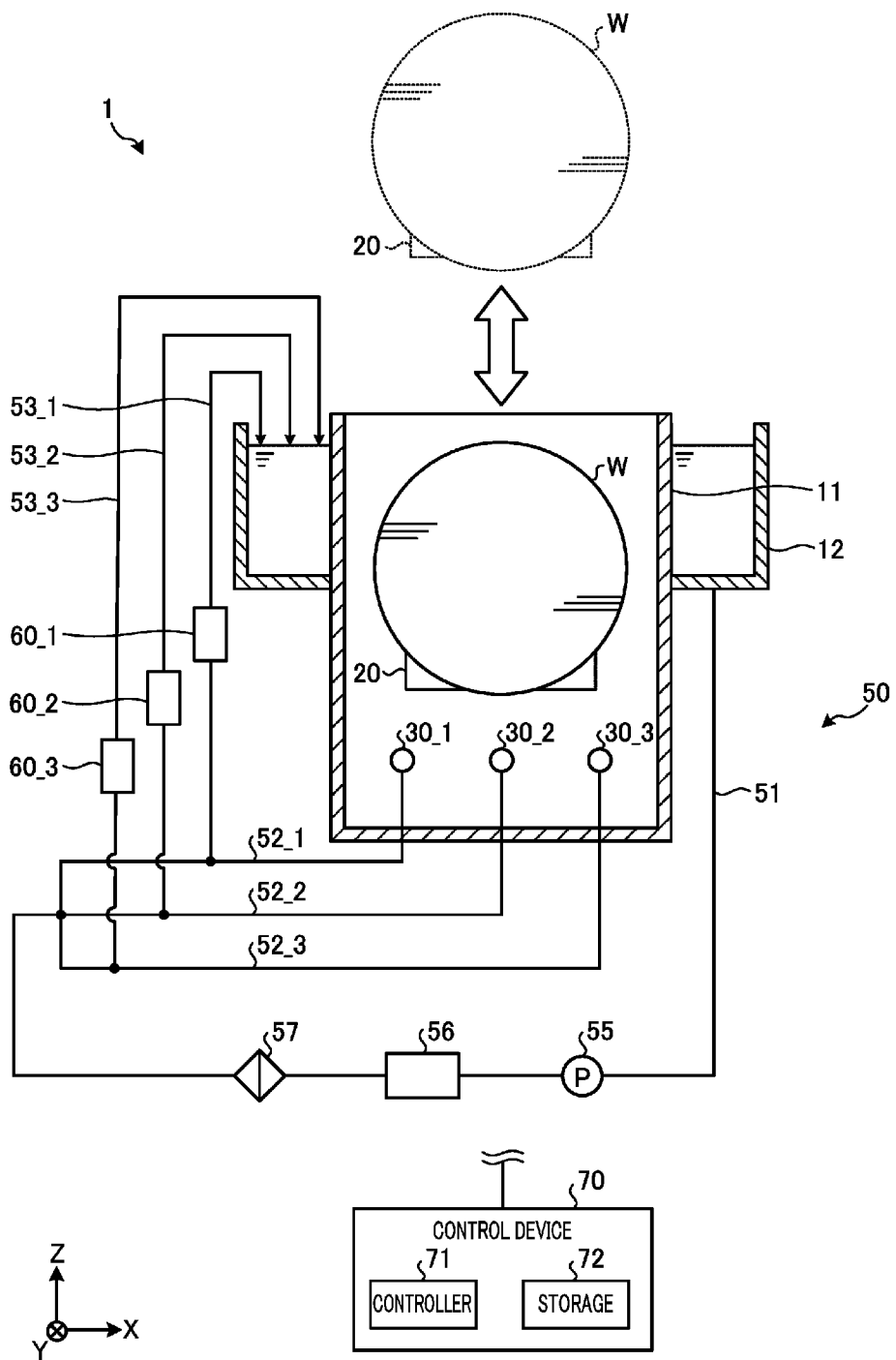
FIG. 2 is a diagram illustrating a configuration of a substrate processing apparatus according to a first exemplary embodiment.

First, a configuration of a substrate processing apparatus according to the first exemplary embodiment will be described with reference to FIG. 2. FIG. 2 is a diagram illustrating the configuration of the substrate processing apparatus 1 according to the first exemplary embodiment.

The substrate processing apparatus 1 shown in FIG. 2 is configured to perform an etching processing upon a plurality of wafers W en bloc by immersing the plurality of wafers W, each of which is held in a vertical posture, in a processing liquid. As stated above, a processing liquid containing phosphoric acid, acetic acid, nitric acid and water is used for the etching processing. By this etching processing, the tungsten film 101 and the titanium nitride films 102 are etched.

As shown in FIG. 2, the substrate processing apparatus 1 according to the first exemplary embodiment includes an inner tub 11, an outer tub 12, a substrate holder 20, processing liquid supplies 30_1 to 30_3, a circulation path 50, flow rate adjusters 60_1 to 60_3, and a control device 70.

In the following description, when the processing liquids 30_1 to 30_3 need not be distinguished from each other, each of them may be simply referred to as a processing liquid supply 30. Further, when the flow rate adjusters 60_1 to 60_3 need not be distinguished from each other, each of them may be simply referred to as a flow rate adjuster 60.

(Inner tub 11 and outer tub 12) The inner tub 11 is a box-shaped water tub having an open top, and stores therein the processing liquid. A lot formed of the plurality of wafers W is immersed in the inner tub 11. The inner tub 11 corresponds to an example of a processing tub in which an etching processing is performed by immersing a plurality of substrates in a processing liquid.

The outer tub 12 is disposed around an upper portion of the inner tub 11. The outer tub 12 has an open top, and stores therein the processing liquid overflown from the inner tub 11. The outer tub 12 corresponds to an overflow tub which stores the processing liquid overflown from the processing tub.

Further, a new liquid supply which replenish the processing liquid may be connected to the outer tub 12. Further, individual supplies respectively configured to supply the phosphoric acid, the acetic acid, the nitric acid and the water as the components of the processing liquid individually may be connected to the outer tub 12.

(Substrate Holder 20)

The substrate holder 20 holds the plurality of wafers W in the vertical posture (vertically standing state). Further, the substrate holder 20 holds the plurality of wafers W at a regular distance therebetween in a horizontal direction (here, the Y-axis direction). The substrate holder 20 is connected to a non-illustrated elevating device, and is capable of moving the plurality of wafers W between a processing position within the inner tub 11 and a standby position above the inner tub 11.

(Processing liquid supply 30) The processing liquid supply 30 is disposed under the plurality of wafers W within the inner tub 11, and discharges the processing liquid into the inner tub 11.

Figure 3:
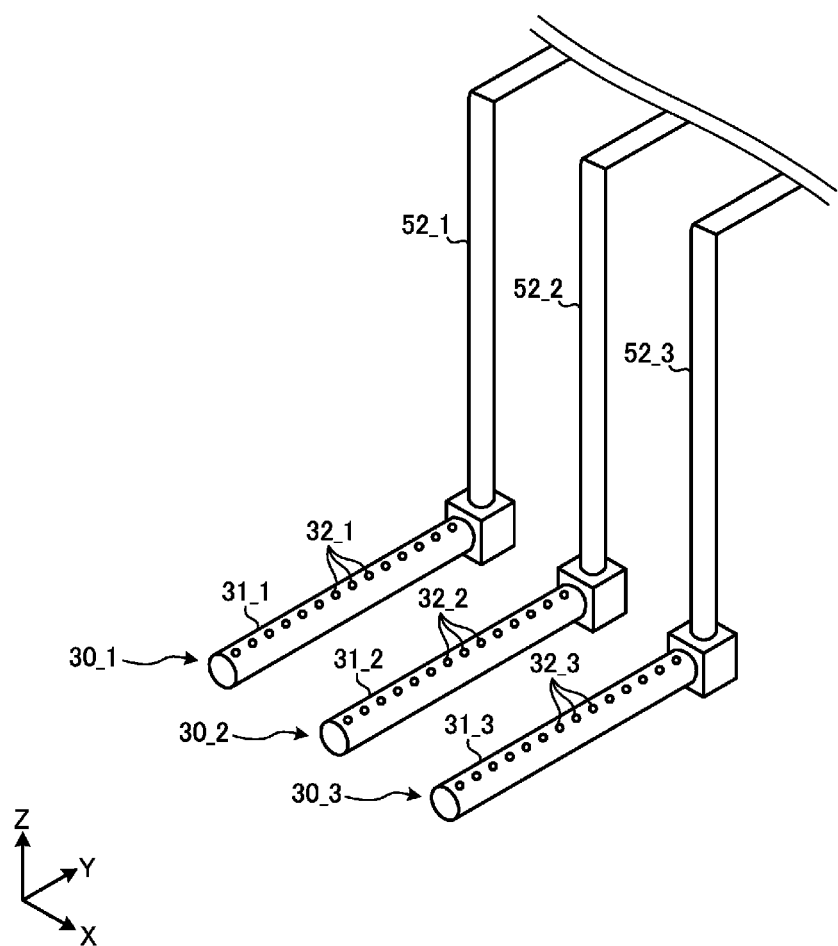
FIG. 3 is a diagram illustrating a configuration of a processing liquid supply according to the first exemplary embodiment.

Here, a configuration of the processing liquid supply 30 will be described with reference to FIG. 3. FIG. 3 is a diagram illustrating the configuration of the processing liquid supply 30 according to the first exemplary embodiment.

As depicted in FIG. 3, the processing liquid supplies 30_1 to 30_3 are equipped with nozzles 31_1 to 31_3, respectively. The nozzles 31_1 to 31_3 are, for example, cylindrical members, and are elongated in an arrangement direction (Y-axis direction) of the plurality of wafers W. Multiple discharge openings 32_1 to 32_3 are formed at upper portions of the nozzles 31_1 to 31_3 along an extension direction of the nozzles 31_1 to 31_3, respectively. Each of the discharge openings 32_1 to 32_3 is of, for example, a circular shape, and has an opening diameter ranging from, e.g., about 0.5 mm to about 1.0 mm. The discharge openings 32_1 to 32_3 discharge the processing liquid upwards in the vertical direction (positive Z-axis direction).

The nozzles 31_1 to 31_3 are connected to supply paths 52_1 to 52_3 to be described later, respectively, and supply the processing liquid from the supply paths 52_1 to 52_3 through the multiple discharge openings 31_1 to 32_3.

(Circulation path 50) Reference is made back to FIG. 2. The circulation path 50 connects the outer tub 12 and the processing liquid supplies 30_1 to 30_3. To elaborate, the circulation path 50 is equipped with a drain path 51, the plurality of supply paths 52_1 to 52_3, and a plurality of bypass paths 53_1 to 53_3. The drain path 51 is connected to a bottom portion of the outer tub 12.

The drain path 51 is provided with a pump 55, a heater 56 and a filter 57. The pump 55 forces the processing liquid within the outer tub 12 out into the drain path 51. The heater 56 heats the processing liquid flowing in the drain path 51 to a temperature adequate for the etching processing. The filter 57 removes impurities from the processing liquid flowing in the drain path 51. The pump 55 and the heater 56 are electrically connected to the control device 70 and controlled by the control device 70.

The plurality of supply paths 52_1 to 52_3 are branched off from the drain path 51. Among them, the supply path 52_1 is connected to the processing liquid supply 30_1; the supply path 52_2, the processing liquid supply 30_2; and the supply path 52_3, the processing liquid supply 30_3.

The plurality of bypass paths 53-1 to 53_3 connect the plurality of supply paths 52_1 to 52_3 and the outer tub 12. To elaborate, the bypass path 53_1 is branched off from the supply path 52_1 and connected to the outer tub 12. The bypass path 53_2 is branched off from the supply path 52_2 and connected to the outer tub 12. Further, the bypass path 53_3 is branched off from the supply path 52_3 and connected to the outer tub 12.

(Flow rate adjuster 60) The flow rate adjusters 60_1 to 60_3 are, for example, LFCs (Liquid Flow Controllers), and serve to adjust flow rates of the processing liquid supplied to the processing liquid supplies 30_1 to 30_3, respectively. That is, the flow rate adjusters 60_1 to 60_3 change the flow rates of the processing liquid discharged from the discharge openings 32_1 to 32_3 of the processing liquid supplies 30_1 to 30_3, respectively.

To be specific, the flow rate adjuster 60_1 is provided at the bypass path 53_1, and serves to change the flow rate of the processing liquid flowing in the bypass path 53_1 to thereby change the flow rate of the processing liquid supplied to the processing liquid supply 30_1 from the supply path 52_1. The flow rate adjuster 60_2 is provided at the bypass path 53_2, and serves to change the flow rate of the processing liquid flowing in the bypass path 53_2 to thereby change the flow rate of the processing liquid supplied to the processing liquid supply 30_2 from the supply path 52_2. The flow rate adjuster 60_3 is provided at the bypass path 53_3, and serves to change the flow rate of the processing liquid flowing in the bypass path 53_3 to thereby change the flow rate of the processing liquid supplied to the processing liquid supply 30_3 from the supply path 52_3.

The flow rate adjusters 60_1 to 60_3 are electrically connected to and controlled by the control device 70.

(Control device 70) The control device 70 is, for example, a computer, and includes a controller 71 and a storage 72. The storage 72 is implemented by a semiconductor memory device such as a RAM or a flash memory, or a storage device such as a hard disk or an optical disk. The storage 72 stores therein a program for controlling various kinds of processings performed in the substrate processing apparatus 1. The controller 71 includes various kinds of circuits and a microcomputer having a CPU (Central Processing Unit), a ROM (Read Only Memory), a RAM (Random Access Memory), input/output port, and so forth, and controls an operation of the substrate processing apparatus 1 by reading and executing the program stored in the storage 72.

The program is recorded on a computer-readable recording medium and may be installed from this recording medium to the storage 72 of the control device 70. The computer-readable recording medium may be, by way of example, but not limitation, a hard disk (HD), a flexible disk (FD), a compact disk (CD), a magnet optical disk (MO), a memory card, or the like.

(Specific operation of the substrate processing apparatus 1)

Figure 4:
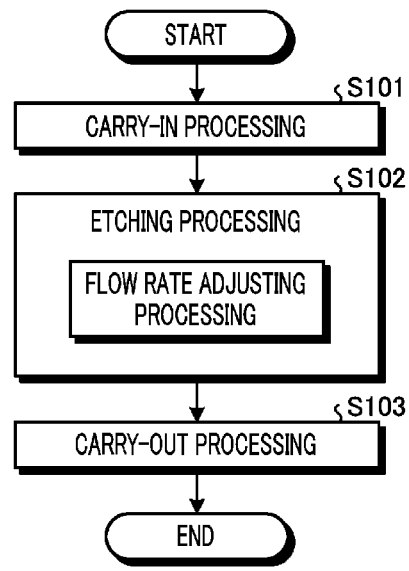
FIG. 4 is a flowchart illustrating a sequence of processings performed by the substrate processing apparatus according to the first exemplary embodiment.

Now, a specific operation of the substrate processing apparatus 1 according to the first exemplary embodiment will be explained with reference to FIG. 3 and FIG. 4. FIG. 4 is a flowchart illustrating a sequence of processings performed by the substrate processing apparatus 1 according to the first exemplary embodiment. Further, the respective processings shown in FIG. 4 are performed under the control of the controller 71.

As depicted in FIG. 4, in the substrate processing apparatus 1, a carry-in processing of immersing the plurality of wafers W in the inner tub 11 is performed (process S101). In the carry-in processing, the controller 71 controls the non-illustrated elevating device belonging to the substrate holder 20 to lower the substrate holder 20, thus allowing the plurality of wafers W to be immersed in the processing liquid stored in the inner tub 11.

Further, the controller 71 controls the pump 55 to start a supply of the processing liquid into the processing liquid supplies 30_1 to 30_3 from the outer tub 12 before the beginning of the carry-in processing. Furthermore, before the carry-in processing is begun, the controller 71 controls the flow rate adjusters 60_1 to 60_3 to close the bypass paths 53_1 to 53_3. That is, before the carry-in processing is begun, the entire processing liquid flowing in the circulation path 50 is supplied into the processing liquid supplies 30_1 to 30_3.

Subsequently, in the substrate processing apparatus 1, an etching processing is performed (process S102). In the etching processing, the state in which the wafers W are immersed in the processing liquid within the inner tub 11 is maintained for a predetermined time period. Accordingly, the tungsten film 101 exposed on the surface is first etched, so that the titanium nitride film 102 is exposed. Then, the tungsten film 101 and the titanium nitride film 102 are etched at the same time.

Thereafter, in the substrate processing apparatus 1, a carry-out processing is performed (process S103). In the carry-out processing, the controller 71 controls the non-illustrated elevating device belonging to the substrate holder 20 to raise the substrate holder 20, thus lifting the plurality of wafers W from the inner tub 11. Upon the completion of this carry-out processing, the controller 71 ends the series of processes of the substrate processing in the substrate processing apparatus 1.

The controller 71 performs, in the middle of the etching processing, a flow rate adjusting processing of changing the flow rates of the processing liquid supplied from the processing liquid supplies 30_1 to 30_3. The content of this flow rate adjusting processing will be discussed with reference to FIG. 5 to FIG. 7.

Figure 5:
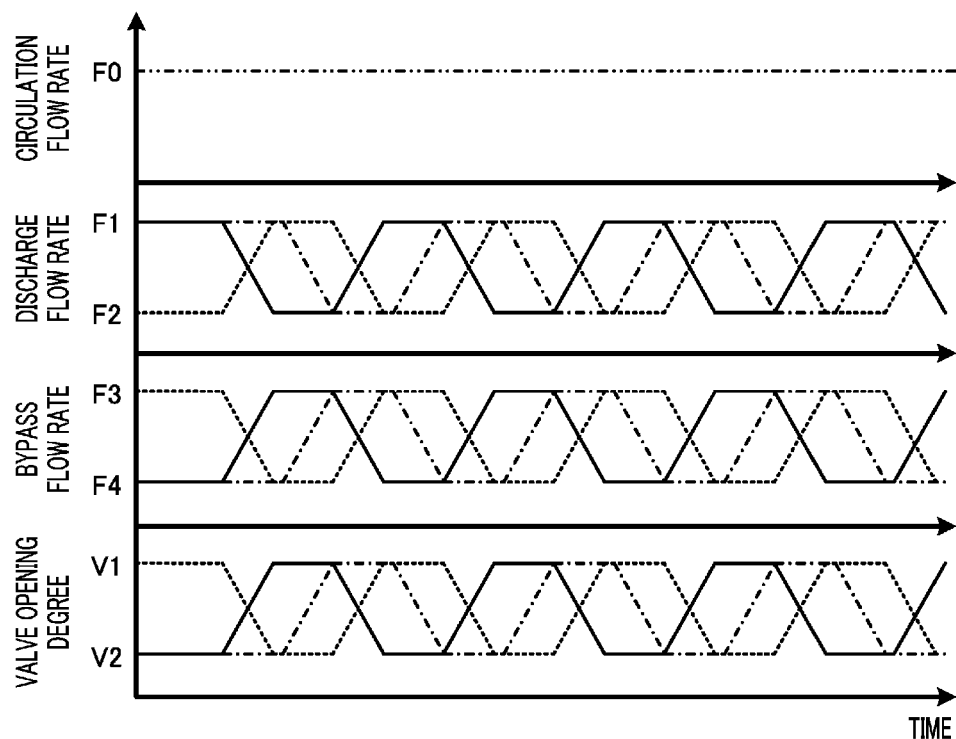
FIG. 5 is an explanatory diagram for describing a flow rate adjusting processing according to the first exemplary embodiment.

FIG. 5 is an explanatory diagram for describing the flow rate adjusting processing according to the first exemplary embodiment. Further, FIG. 6 and FIG. 7 are diagrams illustrating a state in which a position where stagnation of a liquid flow occurs is changed through the flow rate adjusting processing.

FIG. 5 shows variations of "circulation flow rate," "discharge flow rate," "bypass flow rate," and "valve opening degree" with a lapse of time during the etching processing. Here, the "circulation flow rate" refers to a flow rate of the processing liquid flowing in the circulation path 50, and the "discharge flow rate" is a flow rate of the processing liquid discharged from the processing liquid supplies 30_1 to 30_3. Further, the "bypass flow rate" refers to a flow rate of the processing liquid supplied into the outer tub 12 from the bypass paths 53_1 to 53_3, and the "valve opening degree" refers to an opening degree of opening/closing valves (electronic valves) belonging to the flow rate adjusters 60_1 to 60_3.

Further, in FIG. 5, the flow rate or the opening degree corresponding to the processing liquid supply 30_1 is indicated by a solid line; the flow rate or the opening degree corresponding to the processing liquid supply 30_2, a dashed line; and the flow rate or the opening degree corresponding to the processing liquid supply 30_3, a dashed dotted line. Further, in FIG. 5, the circulation flow rate is indicated by a dashed double-dotted line.

Figure 6:
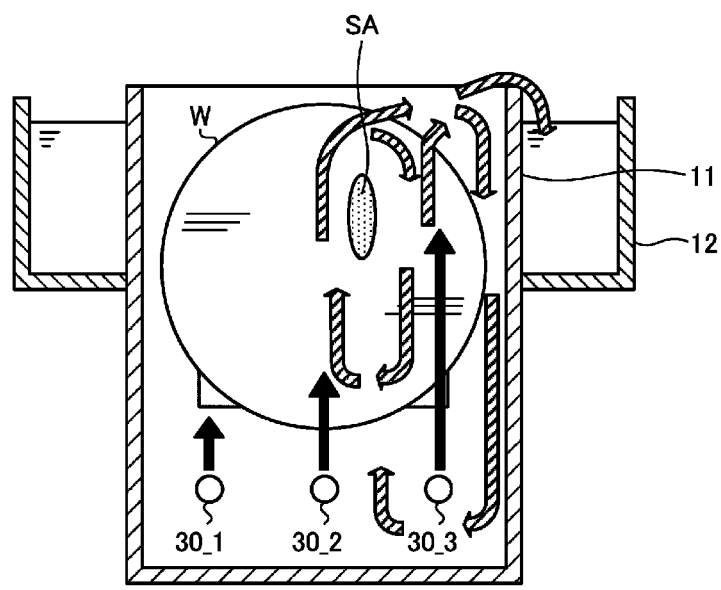
FIG. 6 is a diagram showing a state in which a position where stagnation of a liquid flow occurs is changed by the flow rate adjusting processing.
Figure 7:
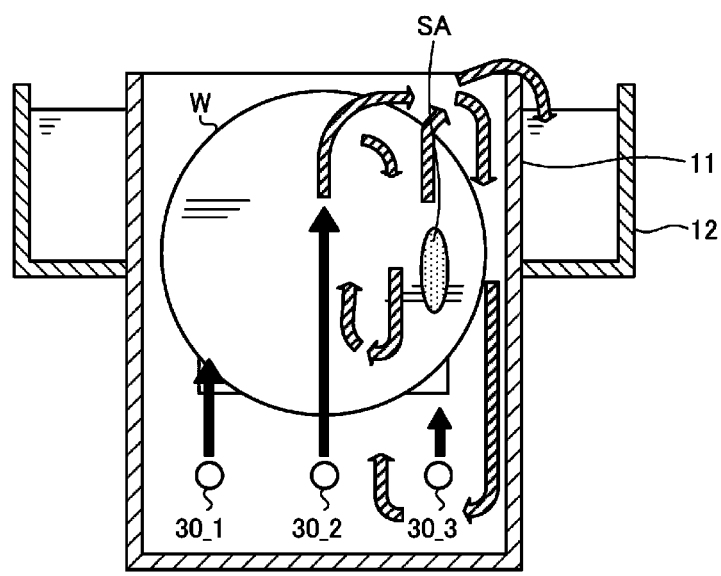
FIG. 7 is a diagram showing a state in which a position where stagnation of a liquid flow occurs is changed by the flow rate adjusting processing.

In FIG. 6 and FIG. 7, the processing liquid discharged from the processing liquid supplies 30_1 to 30_3 is indicated by black arrows, and discharge flow rates of the processing liquid are indicated by the lengths of the black arrows. Further, in FIG. 6 and FIG. 7, a liquid flow of the processing liquid formed within the inner tub 11 is indicated by hatched arrows.

As shown in FIG. 5, the controller 71 varies bypass flow rates by changing valve opening degrees of the flow rate adjusters 60_1 to 60_3, thus allowing the discharge flow rates of the processing liquid supplies 30_1 to 30_3 to be changed.

The controller 71 increases or decreases the flow rate of the processing liquid discharged from the processing liquid supply 30_1, the flow rate of the processing liquid discharged from the processing liquid supply 30_2, and the flow rate of the processing liquid discharged from the processing liquid supply 30_3 to different values.

By way of example, in the example shown in FIG. 5, the controller 71 varies the bypass flow rates between a third flow rate F3 and a fourth flow rate F4 (<F3) alternately by changing the valve opening degrees of the flow rate adjusters 60_1 to 60_3 between a first opening degree V1 and a second opening degree V2 (<V1) alternately. Accordingly, the controller 71 is capable of changing the discharge flow rates of the processing liquid supplies 30_1 to 30_3 between a first flow rate F1 and a second flow rate F2 (<F1) alternately.

In the above-described processing, the controller 71 may set a direction of change of the discharge flow rate to be different between the processing liquid supplies 30_1 to 30_3. For example, the controller 71 increases the discharge flow rate of the processing liquid supply 30_2 from the second flow rate F2 to the first flow rate F1 at a time when it decreases the discharge flow rate of the processing liquid supply 30_1 from the first flow rate F1 to the second flow rate F2. Further, the controller 71 decreases the discharge flow rate of the processing liquid supply 30_2 from the first flow rate F1 to the second flow rate F2 at a time when it increases the discharge flow rate of the processing liquid supply 30_1 from the second flow rate F1 to the first flow rate F1. In this way, by setting the different directions of change of the discharge flow rates between the processing liquid supplies 30_1 to 30_3, the liquid flow of the processing liquid within the inner tub 11 can be disturbed.

Furthermore, the controller 71 may set a timing for changing the discharge flow rate to be different between the processing liquid supplies 30_1 to 30_3. For instance, the controller 71 first decreases the discharge flow rate of the processing liquid supply 30_1 from the first flow rate F1 to the second flow rate F2, and then decreases the discharge flow rate of the processing liquid supply 30_3 from the first flow rate F1 to the second flow rate F2 in a period during which it increases the discharge flow rate of the processing liquid supply 30_1 from the second flow rate F2 to the first flow rate F1. In this way, by setting the timing for changing the discharge flow rate to be different between the processing liquid supplies 30_1 to 30_3, the liquid flow of the processing liquid within the inner tub 11 can be disturbed.

In the substrate processing apparatus 1 according to the first exemplary embodiment, even if stagnation SA of the liquid flow within the inner tub 11 has occurred as illustrated in FIG. 6, a place where the stagnation SA occurs can be changed as shown in FIG. 7 by disturbing the liquid flow of the processing liquid. Accordingly, the wafer W can be suppressed from having an abnormal region where an etching amount is extremely small. That is, uniformity of the etching processing can be improved.

Further, in the substrate processing apparatus 1 according to the first exemplary embodiment, the processing liquid which flows in the circulation path 50 but is not supplied to the processing liquid supplies 30_1 to 30_3 is drained into the outer tub 12 connected to the circulation path 50. Accordingly, as depicted in FIG. 5, it is possible to vary the discharge flow rates of the processing liquid supplies 30_1 to 30_3 while maintaining the circulation flow rate at a constant value F0. In this way, by maintaining the circulation flow rate constant, a load of the pump 55 can be regulated constant. If the load of the pump 55 fluctuates, a pressure applied to the filter 57 would be changed, resulting in a release of a foreign substance from the filter 57. In the substrate processing apparatus 1 according to the first exemplary embodiment, however, by controlling the flow rate adjusters 60_1 to 60_3 so that the circulation flow rate is maintained constant, the load of the pump 55 can be maintained constant. Thus, according to the substrate processing apparatus 1, a release of the foreign substance from the filter 57 can be suppressed.

As illustrated in FIG. 5, the controller 71 may perform the above-described flow rate adjusting processing, that is, the processing of increasing or decreasing the discharge flow rates of the processing liquid supplies 30_1 to 30_3 multiple times during the etching processing. The flow rate adjusting processing may be performed continuously or intermittently. By performing the flow rate adjusting processing multiple times, the effect of disturbing the liquid flow of the processing liquid can be enhanced.

Moreover, the controller 71 may repeat the flow rate adjusting processing until the etching processing ends from the beginning thereof. In this way, by carrying on the flow rate adjusting processing during the entire period of the etching processing, the effect of disturbing the liquid flow of the processing liquid can be further strengthened.

In the example shown in FIG. 5, the discharge flow rate (for example, the first flow rate F1) before the change and the discharge flow rate (for example, the second flow rate F2) after the change are set to be same between the processing liquid supplies 30_1 to 30_3. However, the exemplary embodiment is not limited thereto, and the controller 71 may set at least one of the discharge flow rate before the change or the discharge flow rate after the change to be different between the processing liquid supplies 30_1 to 30_3. Accordingly, the effect of disturbing the liquid flow of the processing liquid can be improved.

In the example shown in FIG. 5, a cycle of the changing of the discharge flow rate (that is, a time taken before the discharge flow rate is returned to an original value after being changed) is set to be same between the processing liquid supplies 30_1 to 30_3. However, the controller 71 may set the cycle of the changing of the discharge flow rate to be different between the processing liquid supplies 30_1 to 30_3. Accordingly, the effect of disturbing the liquid flow of the processing liquid can be enhanced.

Moreover, in the example shown in FIG. 5, the discharge flow rates of the processing liquid supplies 30_1 to 30_3 are changed between the first flow rate F1 and the second flow rate F2. However, the controller 71 may increase or decrease the discharge flow rates of the processing liquid supplies 30_1 to 30_3 in multiple stages. By way of example, the controller 71 may increase (decrease) the discharge flow rates of the processing liquid supplies 30_1 to 30_3, maintain the increased (decreased) discharge flow rates for a certain time, and then increase (decrease) the discharge flow rates further. Accordingly, the effect of disturbing the liquid flow of the processing liquid can be further enhanced.

<Modification Example of Substrate Processing Apparatus 1 According to First Exemplary Embodiment>

Figure 8:
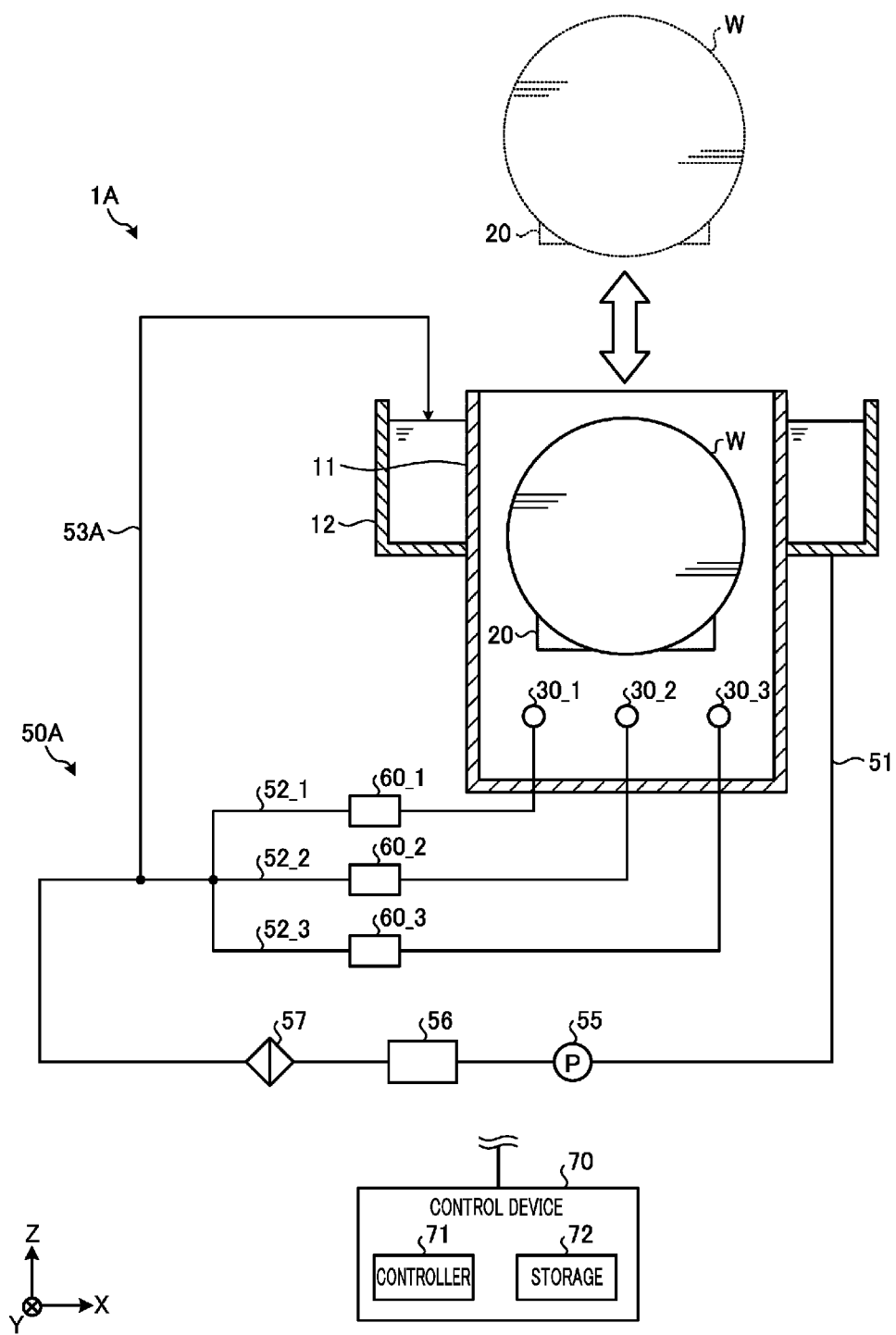
FIG. 8 is a diagram illustrating a configuration of a substrate processing apparatus according to a modification example of the first exemplary embodiment.

Now, a modification example of the substrate processing apparatus 1 according to the above-described first exemplary embodiment will be described with reference to FIG. 8. FIG. 8 is a diagram illustrating a substrate processing apparatus 1A according to the modification example of the first exemplary embodiment.

As depicted in FIG. 8, the substrate processing apparatus 1A according to the modification example is equipped with a circulation path 50A. The circulation path 50A is equipped with a drain path 51, a plurality of supply paths 52_1 to 52_3, and a single bypass path 53A. The bypass path 53A is branched off from the drain path 51 and is connected to an outer tub 12.

Further, in the substrate processing apparatus 1A according to the modification example, flow rate adjusters 60_1 to 60_3 are provided at the supply paths 52_1 to 52_3, respectively. Specifically, the flow rate adjuster 60_1 is provided at the supply path 52_1; the flow rate adjuster 60_2, the supply path 52_2; and the flow rate adjuster 60_3, the supply path 52_3.

Figure 9:
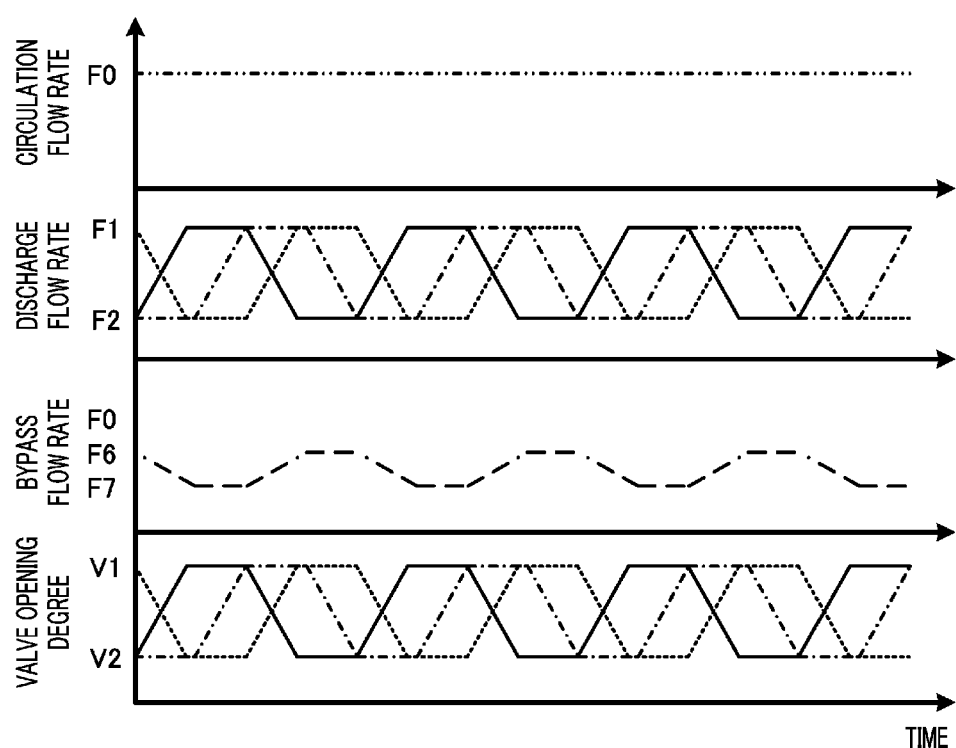
FIG. 9 is an explanatory diagram for describing a flow rate adjusting processing according to the modification example of the first exemplary embodiment.

Now, the content of a flow rate adjusting processing according to the modification example will be described with reference to FIG. 9. FIG. 9 is an explanatory diagram for describing the flow rate adjusting processing according to the modification example of the first exemplary embodiment. In FIG. 9, a bypass flow rate is indicated by a double-dashed dotted line.

As illustrated in FIG. 9, by changing valve opening degrees of the flow rate adjusters 60_1 to 60_3 between a first opening degree V1 and a second opening degree V2, a controller 71 alters discharge flow rates of processing liquid supplies 30_1 to 30_3 between a first flow rate F1 and a second flow rate F2. Accordingly, a liquid flow of the processing liquid within an inner tub 11 can be disturbed, and formation of an abnormal region can be suppressed.

In the modification example, the bypass flow rate varies depending on a sum of the discharge flow rates of the processing liquid supplies 30_1 to 30_3. That is, if the sum of the discharge flow rates of the processing liquid supplies 30_1 to 30_3 increases, the bypass flow rate decreases, whereas if the sum of the discharge flow rates of the processing liquid supplies 30_1 to 30_3 decreases, the bypass flow rate increases. Accordingly, the circulation flow rate can be maintained at a flow rate F0.

SECOND EXEMPLARY EMBODIMENT

Figure 10:
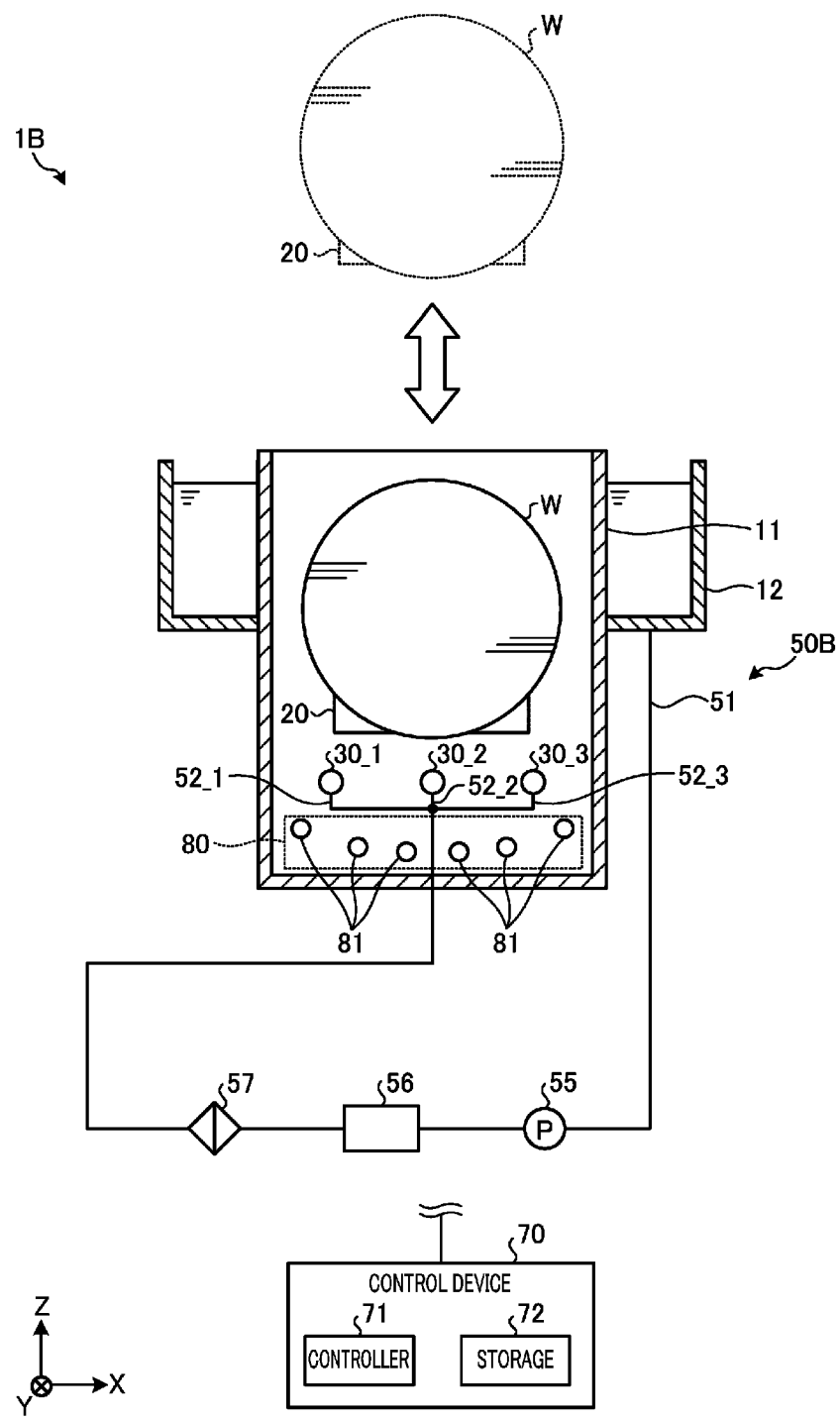
FIG. 10 is a diagram illustrating a configuration of a substrate processing apparatus according to a second exemplary embodiment.

FIG. 10 is a diagram illustrating a configuration of a substrate processing apparatus 1B according to a second exemplary embodiment. As depicted in FIG. 10, the substrate processing apparatus 1B according to the second exemplary embodiment is equipped with a circulation path 50B.

The circulation path 50B has the same configuration as the above-described circulation paths 50 and 50A except that it does not have a bypass path. That is, the circulation path 50B is equipped with a drain path 51 connected to an outer tub 12, and supply paths 52_1 to 52_3 branched off from the drain path 51 and respectively connected to processing liquid supplies 30_1 to 30_3. Further, the drain path 51 is provided with a pump 55, a heater 56 and a filter 57.

Further, the substrate processing apparatus 1B is further equipped with a gas supply 80. The gas supply 80 is disposed under a plurality of wafers W and the multiple processing liquid supplies 30_1 to 30_3 within an inner tub 11. This gas supply 80 is equipped with a multiple number of nozzles 81. By discharging a gas into the inner tub 11 from these nozzles 81, the gas supply 80 creates a liquid flow of a processing liquid within the inner tub 11.

Figure 11:
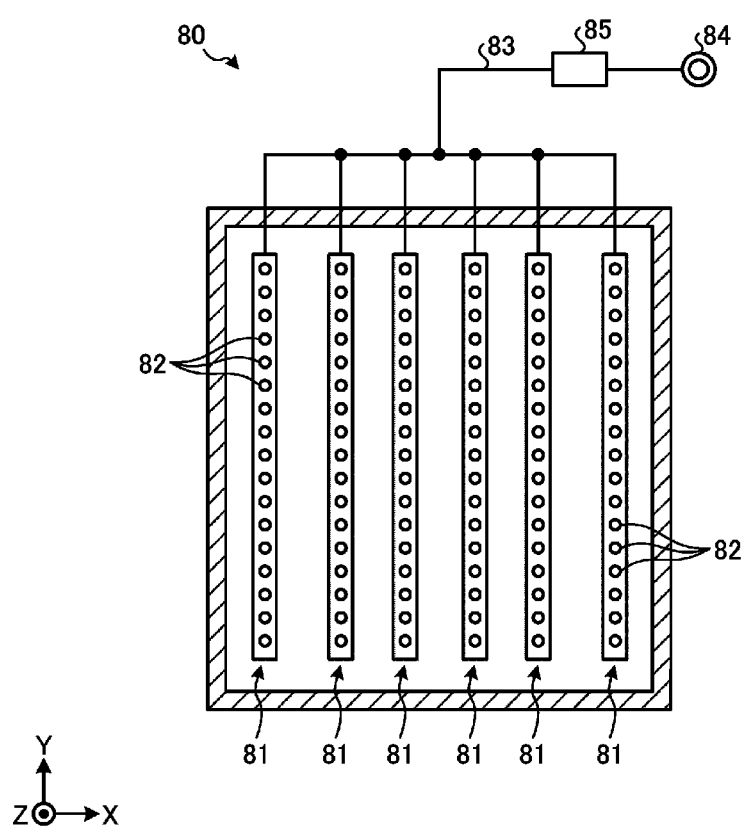
FIG. 11 is a top view of a gas supply according to the second exemplary embodiment.

A configuration of the gas supply 80 will be elaborated with reference to FIG. 11. FIG. 11 is a top view of the gas supply 80 according to the second exemplary embodiment.

As illustrated in FIG. 11, the nozzles 81 of the gas supply 80 are, for example, cylindrical members and elongated in an arrangement direction (Y-axis direction) of the plurality of wafers W. A multiple number of discharge openings 82 are provided at an upper portion of the nozzle 81 in an extension direction of the nozzle 81. Here, however, the discharge openings 82 may not necessarily be provided at the upper portion of the nozzle 81. By way of example, the discharge openings 82 may be provided at a lower portion of the nozzle 81 and configured to discharge the gas diagonally downwards.

The nozzles 81 are connected to a gas source 84 via a supply path 83. The gas source 84 supplies the gas to the nozzles 81. Here, a nitrogen gas is supplied from the gas source 84 to the nozzles 81. However, the gas supplied from the gas source 84 to the nozzles 81 may be an inert gas such as, but not limited to, an argon gas other than the nitrogen gas.

The supply path 83 is provided with a flow rate adjuster 85. The flow rate adjuster 85 is implemented by, for example, a LFC or an opening/closing valve configured to open or close the supply path 83 completely. This flow rate adjuster 85 varies a flow rate of the nitrogen gas supplied from the gas source 84 to the nozzles 81.

Figure 12:
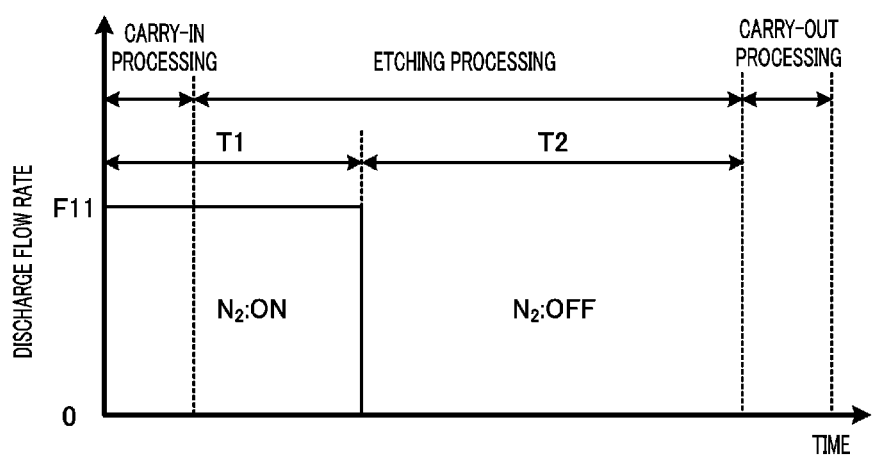
FIG. 12 is an explanatory diagram for describing a flow rate adjusting processing according to the second exemplary embodiment.

Now, the content of a flow rate adjusting processing according to the second exemplary embodiment will be explained with reference to FIG. 12. FIG. 12 is an explanatory diagram for describing the flow rate adjusting processing according to the second exemplary embodiment.

A controller 71 controls the flow rate adjuster 85 to discharge the nitrogen gas from the gas supply 80 at a first flow rate F11 in a period T1. Further, the controller 71 controls the flow rate adjuster 85 to change a discharge flow rate of the nitrogen gas in a period T2 following the period T1 to a second flow rate (here, zero) smaller than the first flow rate F1. The period T2 is continued at least until an etching processing is ended.

Desirably, a start time of the period T2 may be, for example, before a time when a titanium nitride film 102 covered with a tungsten film 101 is exposed in the etching processing.

As described above, by reducing the discharge flow rate of the nitrogen gas in the late etching processing in which the tungsten film 101 and the titanium nitride film 102 are etched at the same time, occurrence of galvanic corrosion can be suppressed.

Further, in the early etching processing when it has not been long after the plurality of wafers W are immersed in the inner tub 11, by discharging the nitrogen gas into the inner tub 11, uniformity of the etching processing can be improved effectively.

Figure 13:
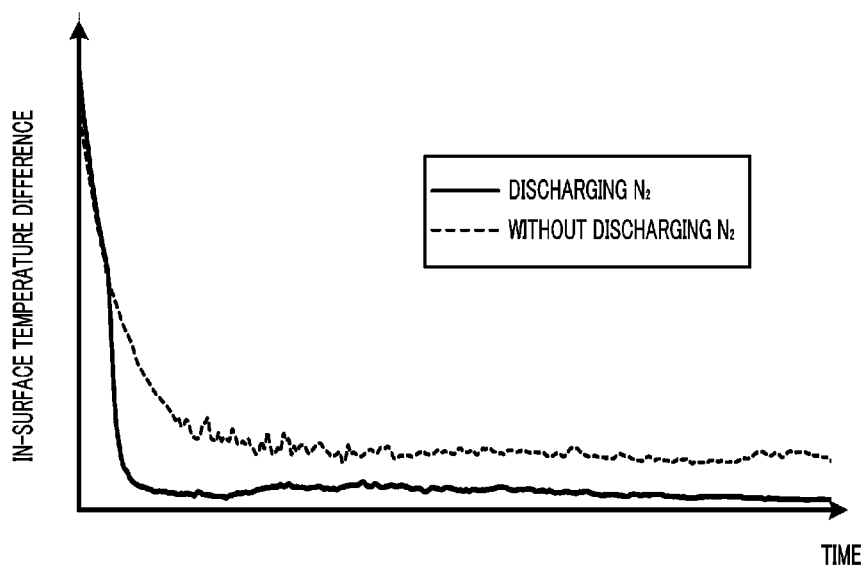
FIG. 13 is a graph showing variations of an in-surface temperature difference in an etching processing with a lapse of time.

This will be elaborated with reference to FIG. 13. FIG. 13 is a graph showing variations of an in-surface temperature difference in the etching processing with a lapse of time. The in-surface temperature difference implies a difference between the highest temperature and the lowest temperature within a surface of the wafer W. In FIG. 13, a variation of the in-surface temperature difference with a lapse of time when the etching processing is performed while discharging the nitrogen gas from the gas supply is indicated by a solid line, and a variation of the in-surface temperature difference with a lapse of time when the etching processing is performed without discharging the nitrogen gas from the gas supply is indicated by a dashed line.

As depicted in FIG. 13, when the etching processing is performed while discharging the nitrogen gas, the in-surface temperature difference of the wafer W can be reduced in a short time as compared to the case when the etching processing is performed without discharging the nitrogen gas. This effect is found to be conspicuous in the early etching processing.

With a decrease of the in-surface temperature difference of the wafer W, non-uniformity of an etching amount within the surface of the wafer W is reduced. Thus, in the period T1 in the initial stage of the etching processing, by performing the etching processing while discharging the nitrogen gas from the gas supply 80, the uniformity of the etching processing can be improved.

As stated above, in the substrate processing apparatus 1B according to the second exemplary embodiment, the discharge of the nitrogen gas from the gas supply 80 is performed in the early stage of the etching processing, whereas in the latter part of the etching processing, a discharge amount of the nitrogen gas is delimited, more desirably, the discharge of the nitrogen gas is stopped. Accordingly, in the early etching processing, by reducing the in-surface temperature difference of the wafer W in the early stage, the in-surface uniformity of the etching processing can be improved. Further, in the late etching processing, by suppressing occurrence of galvanic corrosion, degradation in the in-surface uniformity of the etching processing can be suppressed.

Thus, by using the substrate processing apparatus 1B according to the second exemplary embodiment, uniformity of the etching processing can be improved in the technique of etching the plurality of wafers W, each of which has multiple kinds of metal layers formed thereon, en bloc.

Further, in the example shown in FIG. 12, the period T1 includes a carry-in processing prior to the beginning of the etching processing. Here, however, it is desirable that the period T1 includes a period after the beginning of the etching processing at least. Further, the start time of the period T1 may be, for example, a time immediately before the plurality of wafers W are begun to be immersed in the processing liquid within the inner tub 11 or a time immediately after the immersion of the plurality of wafers W in the processing liquid within the inner tub 11 is finished. Furthermore, the start time of the period T1 may be set to be a time between the time when the immersion of the plurality of wafers W in the processing liquid within the inner tub 11 is begun and the time when the immersion of these wafers W is ended.

(Other modification examples)

The first exemplary embodiment has been described for the example where the substrate processing apparatus 1 (1A) is equipped with the three nozzles 31_1 to 31_3. However, the exemplary embodiment is not limited thereto, and the substrate processing apparatus 1 (1A) may be equipped with at least two or more nozzles.

The first exemplary embodiment has been described for the example where the substrate processing apparatus 1 (1A) is equipped with the three nozzles 31_1 to 31_3, and the discharge openings 32_1 to 32_3 are provided at the nozzles 31_1 to 31_3, respectively. However, the exemplary embodiment is not limited thereto, and the substrate processing apparatus 1 (1A) may be equipped with a processing liquid supply having, for example, a single flat plate-shaped member provided with a plurality of discharge opening groups (including a first discharge opening group and a second discharge opening group) having different supply paths.

As stated above, the substrate processing apparatus according to an exemplary embodiment (as an example, the substrate processing apparatus 1 (1A)) includes a processing tub (as an example, the inner tub 11); a first discharge opening group (as an example, any one of the plurality of discharge openings 32_1 to 32_3 provided at the processing liquid supplies 30_1 to 30_3) and a second discharge opening group (as an example, another one of the plurality of discharge openings 32_1 to 32_3 provided at the processing liquid supplies 30_1 to 30_3); a first adjuster (as an example, any one of the plurality of flow rate adjusters 60_1 to 60_3); a second adjuster (as an example, another one of the plurality of flow rate adjusters 60_1 to 60_3); and a controller (as an example, the controller 71). The processing tub is configured to perform an etching processing therein by immersing a plurality of substrates (as an example, the wafers W) in a processing liquid. The first discharge opening group and the second discharge opening group are disposed under the plurality of substrates within the processing tub, and discharge the processing liquid into the processing tub. The first adjuster is configured to change a flow rate of the processing liquid discharged from the first discharge opening group. The second adjuster is configured to change a flow rate of the processing liquid discharged from the second discharge opening group. The controller controls the first adjuster and the second adjuster to perform, in the middle of the etching processing, a flow rate adjusting processing of increasing or decreasing the flow rate of the processing liquid discharged from the first discharge opening group and the flow rate of the processing liquid discharged from the second discharge opening group to different values. Thus, according to the substrate processing apparatus of the present exemplary embodiment, in the technique of etching the plurality of substrates en bloc, uniformity of the etching processing can be improved.

The controller may perform the flow rate adjusting processing multiple times. By the repetition of this flow rate adjusting processing, an effect of disturbing a liquid flow of the processing liquid can be enhanced.

The controller may repeat the flow rate adjusting processing until the etching processing is ended after it is begun. Accordingly, the effect of disturbing the liquid flow of the processing liquid can be further improved.

The controller may perform, in the flow rate adjusting processing, a processing of changing the flow rate of the processing liquid discharged from the first discharge opening group and a processing of changing the flow rate of the processing liquid discharged from the second discharge opening group at different times. In this way, by setting the times when the discharge flow rates of the first discharge opening group and the second discharge opening group are changed to be different from each other, the liquid flow of the processing liquid within the processing tub can be disturbed.

The controller may decrease the flow rate of the processing liquid discharged from the second discharge opening group at a time when the flow rate of the processing liquid discharged from the first discharge opening group is increased. In this way, by setting the directions of the change of the discharge flow rates to be different between the first discharge opening group and the second discharge opening group, the liquid flow of the processing liquid within the processing tub can be disturbed.

The substrate processing apparatus (as an example, the substrate processing apparatus 1) according to the exemplary embodiment may be equipped with an overflow tub (as an example, the outer tub 12); and a circulation path (as an example, the circulation path 50). The overflow tub stores therein the processing liquid overflown from the processing tub. The circulation path connects the overflow tub and the first and second discharge opening groups. Further, the circulation path may be equipped with a drain path (as an example, the drain path 51); a first supply path (as an example, any one of the plurality of supply paths 52_1 to 52_3); a second supply path (as an example, another one of the plurality of supply paths 52_1 to 52_3); a first bypass path (as an example, any one of the plurality of bypass paths 53_1 to 53_3); and a second bypass path (as an example, another one of the plurality of bypass paths 53_1 to 53_3). The drain path is connected to the overflow tub. The first supply path is branched off form the drain path and connected to the first discharge opening group. The second path is branched off from the drain path and connected to the second discharge opening group. The first bypass path is branched off from the first supply path and connected to the overflow tub. The second bypass path is branched off from the second supply path and connected to the overflow tub. In this configuration, the first adjuster may be provided in the first bypass path. Further, the second adjuster may be provided in the second bypass path. By building up this configuration, it is possible to change the discharge flow rates of the first and second discharge opening groups while maintaining a circulation flow rate constant. Accordingly, as a load of a pump can be maintained constant, release of impurities from a filter can be suppressed.

The substrate processing apparatus (as an example, the substrate processing apparatus 1A) according to the exemplary embodiment may be equipped with an overflow tub (as an example, the outer tub 12); and a circulation path (as an example, the circulation path 50A). The overflow tub stores therein the processing liquid overflown from the processing tub. The circulation path connects the overflow tub and the first and second discharge opening groups. Further, the circulation path may be equipped with a drain path (as an example, the drain path 51); a first supply path (as an example, any one of the plurality of supply paths 52_1 to 52_3); a second supply path (as an example, another one of the plurality of supply paths 52_1 to 52_3); a bypass path (as an example, the bypass path 53A). The drain path is connected to the overflow tub. The first supply path is branched off form the drain path and connected to the first discharge opening group. The second path is branched off from the drain path and connected to the second discharge opening group. The bypass path is branched off from the drain path and connected to the overflow tub. In this configuration, the first adjuster may be provided in the first supply path. Further, the second adjuster may be provided in the second supply path. By building up this configuration, it is possible to change the discharge flow rates of the first and second discharge opening groups while maintaining a circulation flow rate constant. Accordingly, a load of a pump, for example, can be maintained constant, and, thus, release of impurities from a filter can be suppressed.

The controller may perform the flow rate adjusting processing by controlling the first adjuster and the second adjuster so that a flow rate of the processing liquid flowing in the circulation path is maintained constant. Accordingly, a load of a pump, for example, can be maintained constant, and, thus, release of impurities from a filter can be suppressed.

Moreover, the substrate processing apparatus (as an example, the substrate processing apparatus 1B) according to the exemplary embodiment is equipped with a processing tub (as an example, the inner tub 11); a gas supply (as an example, the gas supply 80); an adjuster (as an example, the flow rate adjuster 85); and a controller (as an example, the controller 71). The processing tub is configured to perform an etching processing therein by immersing a plurality of substrates (as an example, the wafers W) having multiple kinds of metal layers thereon in a processing liquid. The gas supply is disposed under the plurality of substrates within the processing tub, and discharges a gas (as an example, the nitrogen gas) into the processing tub. The adjuster is configured to vary a flow rate of the gas discharged from the gas supply. The controller controls the adjuster to change the flow rate of the gas discharged from the gas supply to a second flow rate (as an example, zero (0)) after discharging the gas from the gas supply at a first flow rate (as an example, the first flow rate F11) in a period (as an example, the period T1) after the beginning of the etching processing. Here, the second flow rate is smaller than the first flow rate. Accordingly, by using the substrate processing apparatus according to the exemplary embodiment, it is possible to improve uniformity of the etching processing in the technique of etching the plurality of substrates, each of which has the multiple kinds of metal layers formed thereon, en bloc.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to improve etching uniformity in etching a plurality of substrates at once.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a processing tub configured to perform an etching processing therein by immersing multiple substrates in a processing liquid;
a first discharge opening group and a second discharge opening group disposed under the multiple substrates within the processing tub, and configured to discharge the processing liquid into the processing tub;
a first adjusting device configured to change a flow rate of the processing liquid discharged from the first discharge opening group;
a second adjusting device configured to change a flow rate of the processing liquid discharged from the second discharge opening group;
a controller configured to control the first adjusting device and the second adjusting device to perform, during the etching processing, a flow rate adjusting processing of increasing and decreasing the flow rate of the processing liquid discharged from the first discharge opening group and the flow rate of the processing liquid discharged from the second discharge opening group to different values;
an overflow tub configured to store therein the processing liquid overflown from the processing tub; and
a circulation path configured to connect the overflow tub with the first discharge opening group and the second discharge opening group,
wherein the circulation path comprises:
a drain path connected to the overflow tub;
a supply path branched off from the drain path and connected to the first discharge opening group and the second discharge opening group; and
a bypass path branched off from the supply path and connected to the overflow tub,
wherein the first adjusting device and the second adjusting device are provided in the bypass path,
wherein the controller is configured to control the first and second adjusting devices to change the flow rate of the processing liquid flowing in the bypass path.

2. The substrate processing apparatus of claim 1,
wherein the controller performs the flow rate adjusting processing multiple times.

3. The substrate processing apparatus of claim 2,
wherein the controller repeats the flow rate adjusting processing until the etching processing is ended after the etching processing is begun.

4. The substrate processing apparatus of claim 2,
wherein the controller performs, in the flow rate adjusting processing, a processing of changing the flow rate of the processing liquid discharged from the first discharge opening group and a processing of changing the flow rate of the processing liquid discharged from the second discharge opening group at different timings.

5. The substrate processing apparatus of claim 2,
wherein, in the flow rate adjusting processing, the controller decreases the flow rate of the processing liquid discharged from the second discharge opening group at a timing when increasing the flow rate of the processing liquid discharged from the first discharge opening group.

6. The substrate processing apparatus of claim 2,
wherein the supply path comprises:
a first supply path branched off from the drain path and connected to the first discharge opening group; and
a second supply path branched off from the drain path and connected to the second discharge opening group;
wherein the bypass path comprises:
a first bypass path branched off from the first supply path and connected to the overflow tub; and
a second bypass path branched off from the second supply path and connected to the overflow tub, and
wherein the first adjusting device is provided in the first bypass path, and
the second adjusting device is provided in the second bypass path.

7. The substrate processing apparatus of claim 1,
wherein the controller performs, in the flow rate adjusting processing, a processing of changing the flow rate of the processing liquid discharged from the first discharge opening group and a processing of changing the flow rate of the processing liquid discharged from the second discharge opening group at different timings.

8. The substrate processing apparatus of claim 1,
wherein in the flow rate adjusting processing, the controller decreases the flow rate of the processing liquid discharged from the second discharge opening group at a timing when increasing the flow rate of the processing liquid discharged from the first discharge opening group.

9. The substrate processing apparatus of claim 1,
wherein the supply path comprises:
a first supply path branched off from the drain path and connected to the first discharge opening group; and
a second supply path branched off from the drain path and connected to the second discharge opening group;
wherein the bypass path comprises:

a first bypass path branched off from the first supply path and connected to the overflow tub; and a second bypass path branched off from the second supply path and connected to the overflow tub, and wherein the first adjusting device is provided in the first bypass path, and the second adjusting device is provided in the second bypass path.

10. The substrate processing apparatus of claim 9, wherein the controller performs the flow rate adjusting processing by controlling the first adjusting device and the second adjusting device such that a flow rate of the processing liquid flowing in the circulation path is maintained constant.

\* \* \* \* \*